(12) United States Patent
Castagnetti et al.

(10) Patent No.: US 6,828,653 B1
(45) Date of Patent: Dec. 7, 2004

(54) METHOD OF FORMING METAL FUSES IN CMOS PROCESSES WITH COPPER INTERCONNECT

(75) Inventors: Ruggero Castagnetti, Menlo Park, CA (US); Prabhakar Pati Tripathi, Santa Clara, CA (US); Ramnath Venkatraman, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/678,245

(22) Filed: Oct. 3, 2003

Related U.S. Application Data

(62) Division of application No. 09/991,187, filed on Nov. 14, 2001, now Pat. No. 6,664,141.
(60) Provisional application No. 60/311,509, filed on Aug. 10, 2001.

(51) Int. Cl.[7] .................................... H01L 29/00
(52) U.S. Cl. ........................................ 257/529
(58) Field of Search ................. 438/128, 132; 257/209, 528, 529

(56) References Cited

U.S. PATENT DOCUMENTS

| | | | | | |
|---|---|---|---|---|---|
| 5,731,624 | A | * | 3/1998 | Motsiff et al. | 257/529 |
| 6,559,042 | B2 | * | 5/2003 | Barth et al. | 438/601 |
| 6,730,982 | B2 | * | 5/2004 | Barth et al. | 257/529 |

* cited by examiner

*Primary Examiner*—Evan Pert
(74) *Attorney, Agent, or Firm*—Beyer Weaver & Thomas LLP

(57) ABSTRACT

The present invention provides a method of forming a semiconductor device fuse and a semiconductor device fuse structure. A first dielectric layer is formed on top of a metal layer in a semiconductor device. The dielectric layer is patterned to provide access to at least two contacts in the metal layer. A conductive metal layer is deposited and patterned to form a fuse between the fuse contacts. A second dielectric layer is deposited on the conductive metal layer.

6 Claims, 4 Drawing Sheets

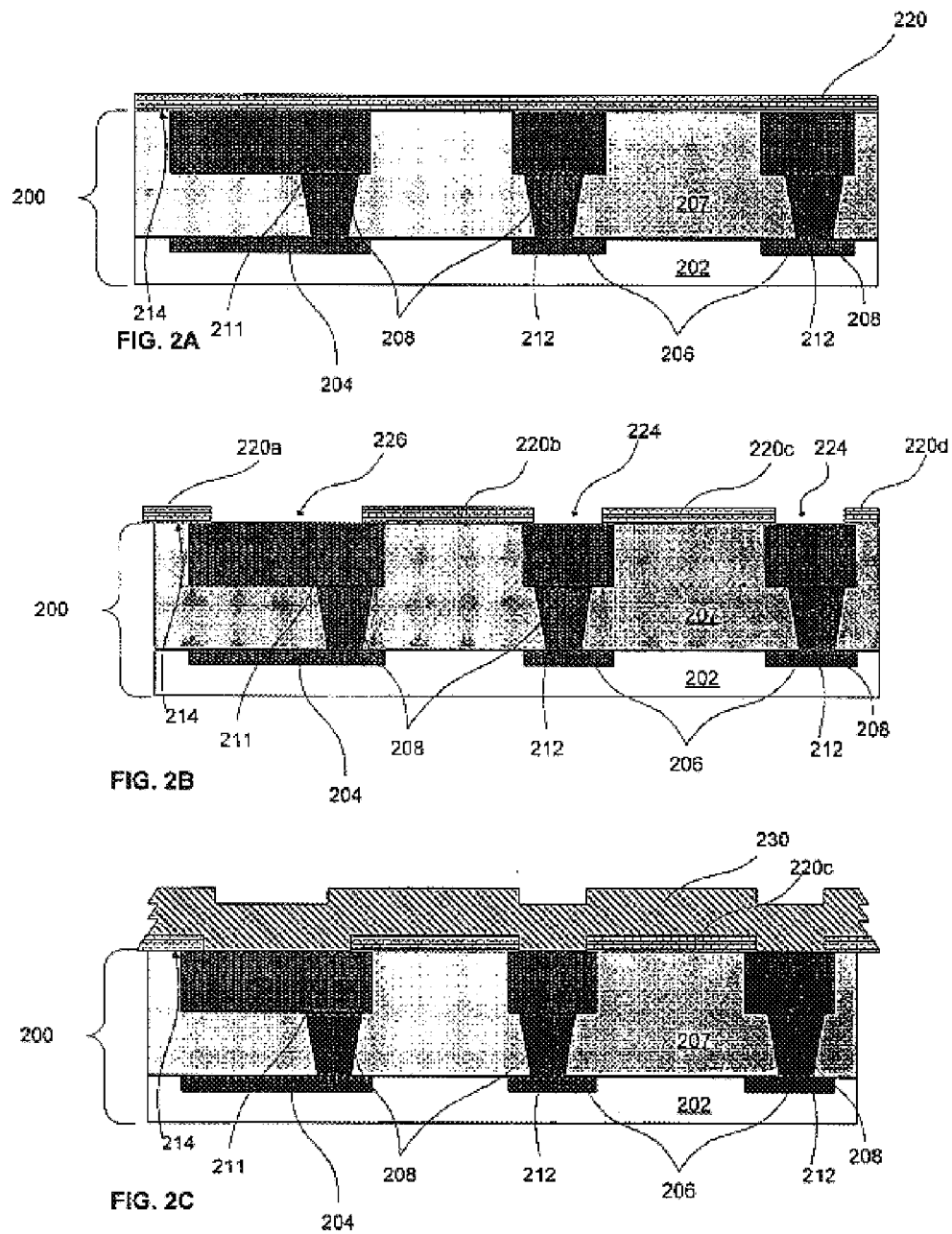

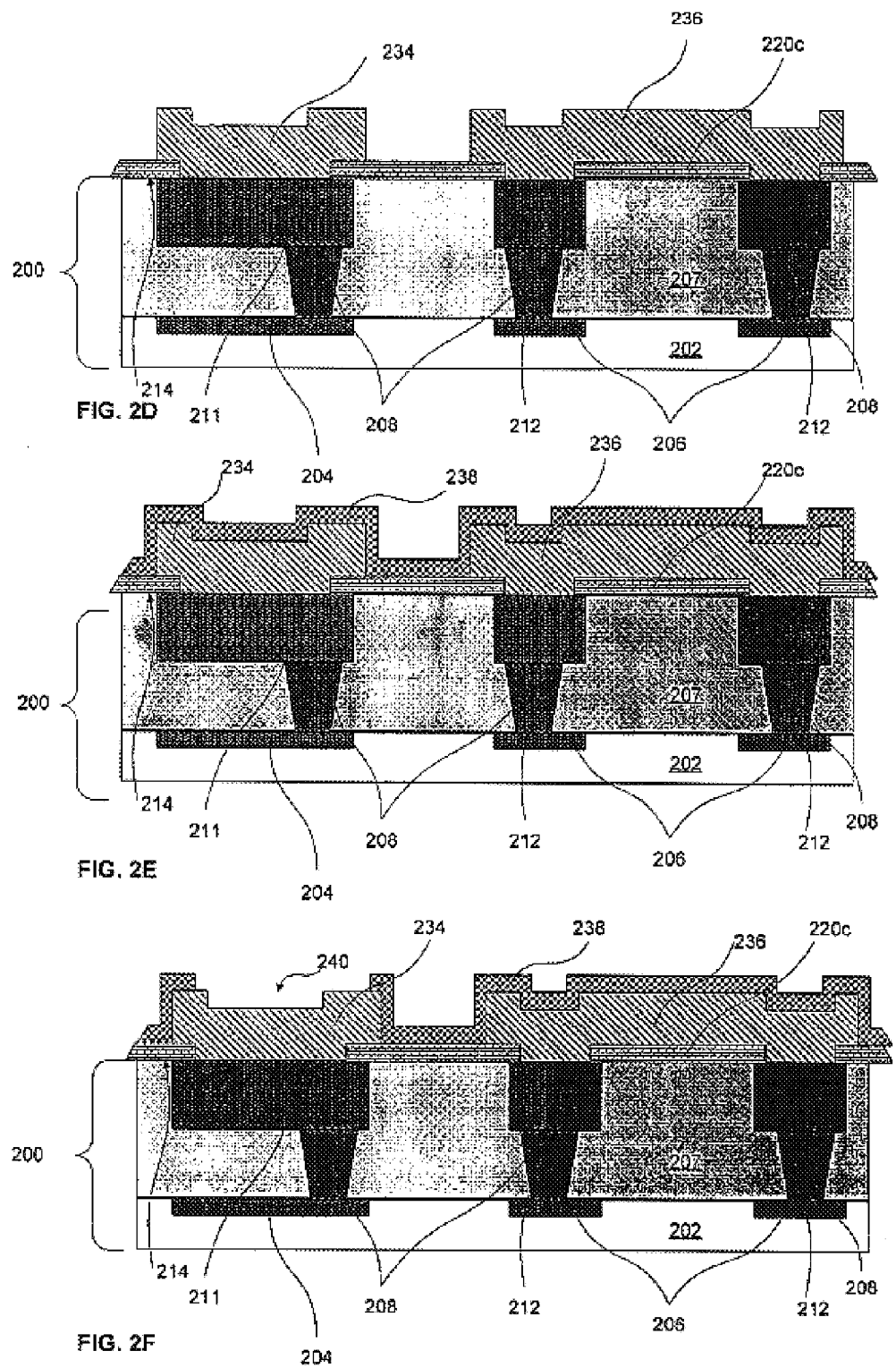

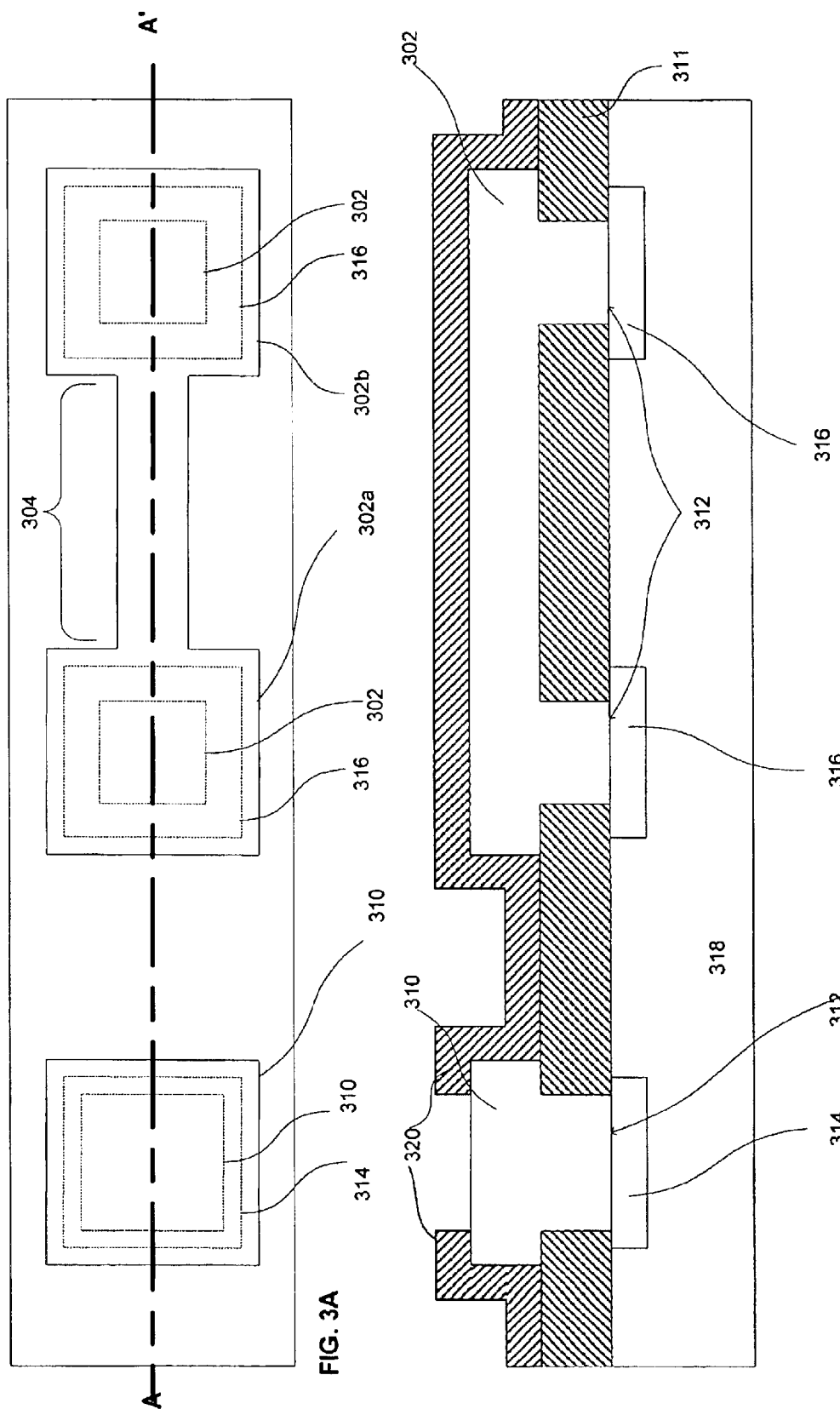

METHOD OF FORMING METAL FUSES IN CMOS PROCESSES WITH COPPER INTERCONNECT

CROSS-REFERENCE TO RELATED APPLICATIONS

This is a Continuation application of prior application Ser. No. 09/991,187 filed on Nov. 14, 2001 now U.S. Pat. No. 6,664,141.

This application claims priority of U.S. Provisional Patent Application Ser. No. 60/311,509 filed, Aug. 10, 2001, entitled "A METHOD OF FORMING METAL FUSES IN CMOS PROCESSES WITH COPPER INTERCONNECT", which is incorporated by reference herein in its entirety.

BACKGROUND OF THE INVENTION

1. Field of the Invention

The present invention relates to techniques for forming metal fuses in CMOS processes with copper. More particularly, the present invention relates to forming metal fuses in device structures having copper interconnect layers.

2. Description of the Related Art

As semiconductor devices, such as integrated circuit chips, continue to decrease in size and increase in complexity, the likelihood of a defective chip resulting from a failed element or a defective conductor increases. One way to reduce the number of chips which must be discarded due to fabrication defects is to manufacture fuses into semiconductor devices. Fuses may be opened to isolate defective areas and allow the rest of the circuit on a chip to be used. Fuses may also be used to trim a circuit, enable a particular mode, or enable or disable different segments of a circuit.

One example of the use of fuses in semiconductor devices is the provision of redundant elements on integrated circuits. If a primary element is defective a redundant element can be substituted for that defective element, rather than discarding the chip. An example of a semiconductor device which uses redundant elements is electronic memory. Typical memory chips are composed of millions of equivalent memory cells arranged in addressable rows and columns. Semiconductor memory chips are typically fabricated with built-in redundancy in case one or more bits are found to be bad after fabrication. If a bad bit is found in testing following fabrication, fuses may be blown to "program" a redundant cell to respond to the address of the defective primary cell. The use of the redundant rows and columns in memory cells increases economic efficiency by substantially raising yields. That is, an entire chip need not be rejected in the event that only a few bits of memory are bad since those bad bits may be replaced by the redundancy built into the chip.

Recently, redundancy circuits employing fuses have been applied in Application Specific Integrated Circuits ("ASIC's") with larger amounts of embedded memory. Embedded memory is a combination of memory and logic on the same chip formed during the same fabrication process. For example, an embedded memory cell may include a single silicon layer processed to form transistor devices for both logic and memory functions covered by a series of metal layers which provide routing and interconnects to the silicon layer. Embedded memory cell arrays typically have, for example, two to six metal layers. Since the silicon logic and memory layer is overlaid by metal layers in an embedded memory cell device, it is preferred to use fuses in an upper metal layer to disable bad bits or enable redundant bits built into an embedded memory array. Redundancy is built into embedded memory arrays for the same reason as stand-alone memory, that is, to increase economic efficiency by increasing yield.

The conventional approach in using a laser to blow such fuses is to irradiate the fuse with a pulsed laser beam whose energy density and pulse duration are sufficient to vaporize the fuse material, thereby severing the electrical link. As a result of the process of blowing the filses, in conventional methods, the fuse and the surrounding dielectric layer may be exposed to the atmosphere.

The ongoing miniaturization of devices presents new problems in forming and blowing fuses. The scaling of semiconductor devices has resulted in some shifting to the use of copper interconnects and low-k dielectric materials to increase circuit and chip performance by reducing interconnect resistance and capacitance. However, copper readily oxidizes in a non self-limited reaction when exposed to air, such as may occur when the fuse is blown. This can lead to regrowth of blown copper fuses (i.e. an unintended rejoining of the severed ends of a copper fuse) causing the chip to fail. Low-k materials are porous and easily absorb moisture from air. If, after blowing the metal fuse the low-k material is exposed, excess moisture absorption may ultimately cause the chip to fail.

Moreover, power supply scaling may result in a device structure having one or more thick metal redistribution layers to efficiently distribute power across the chip while minimizing the voltage drop along the power lines. Generally it is advisable to have thick redistribution metal layers to avoid a voltage drop from the periphery to the center of the chip. However, these thick redistribution layers may be unsuitable for use in the formation of metal fuses. Redistribution layers, for example, may be about 1.0 to 3.0 microns in thickness and preferably between 1.5 and 3.0 microns in 0.13 micron device technology, thus making it difficult to blow the fuse without exceeding the thermal capacity of the device. Typical processing methods use copper for all metal layers except for the pad metal. Copper's high thermal conductance characteristic requires greater heat to blow the fuse than a same thickness fuse made from other metals such as aluminum.

Although fuses have conventionally been placed in some layer below the topmost metal layer, the addition of one or more dielectric layers and one or more redistribution layers placed above the top-most metal layer create additional difficulties in producing a fuse which will reliably blow. The thickness of the conductors in the redistribution layers makes them unsuitable for fuse formation due to the high thermal conductance of copper.

The thickness of the dielectric on top of the fuse portion to be blown is desirably optimized so that the dielectric at that location absorbs the maximum incident laser energy, allowing the fuse to blow more easily. This is conventionally accomplished by partially etching the dielectric layers over the fuse to create an opening over the fuse area to be blown. However, adding one or more redistribution layers adds one or more dielectric layers which must be etched in order to create the window to a desired depth.

For example, FIG. 1 depicts a semiconductor device having a fuse 109 formed by conventional techniques. A first layer of low k dielectric material 102 is placed over a portion of the integrated circuit device. "Low k dielectric material" refers to a dielectric material having a dielectric constant k which is below the dielectric constant of silicon dioxide ($SiO_2$). Preferably this low k value is below 3.5 and most preferably below 3.0. In the upper surface of the low-k dielectric material 102 an opening is etched and later filled with a filler material such as copper to form metal layer (MT-1) 104. Fuse 109 may be formed in this same metal layer according to the same technique. A process step such as chemical mechanical polishing ("CMP") planarizes the surface 105 in preparation for deposition of additional layers. A second low-k dielectric material 106 is then deposited on the planarized surface 105 of the combined layers 102 and 104 to enable formation of a top metal layer 108. The top metal layer 108 is formed by methods similar to those used in the formation of the metal layer 104 described above, i.e. by damascene etching followed by depositing a filler metal such as copper, and planarizing the surface 111. A dielectric material 112 is then deposited. Fluorinated silicate glass ("FSG") is commonly used for this dielectric layer 112. FSG may be formed by doping $SiO_2$ with fluoride to reduce its k value to approximately 3.6. Openings are etched into the upper surface of the dielectric layer 112 and filled with a filler metal such as copper to form redistribution layer 114. The redistribution metal layer 114 and dielectric 112 are planarized using conventional CMP procedures. The embodiments of the present invention may use these steps or other conventional steps to form a partially completed semiconductor device up to and including a redistribution metal layer The remaining stages using conventional techniques will be further described to highlight some of the problems created using conventional techniques. Subsequently a second dielectric layer 118 is deposited on the redistribution metal layer 114. After patterning and etching the second dielectric layer 118 to form opening 123, a conductive barrier layer 116 is deposited in the opening 123 and on the second dielectric layer 118. Subsequently metal pad layer 120 is deposited using a metal such as aluminum. Both metal pad layers 116 and 120 are patterned and etched to form the final configuration of metal pad 120. Separately, opening 122 is formed by initially patterning and etching second dielectric layer 118, followed by etching of layers 112 and 106. In conventional processes, the depth of the opening 122 is accurately controlled in order to provide an optimal thickness for the dielectric overlying the portion of the fuse to be blown. However, the dielectric thickness presented by the multiple layers makes it difficult to accurately control the depth of the opening 122 and thus the thickness 124 of the dielectric over the fuse. Thus conventional methods for forming copper fuses may not produce a fuse that will reliably blow, especially when one or more metal redistribution layers are incorporated into the device.

Accordingly, it is desirable to produce a semiconductor fuse that will reliably blow in a device having copper interconnects, low-k dielectric layers, or a redistribution layer.

SUMMARY OF THE INVENTION

To achieve the foregoing, the present invention provides a method of forming a semiconductor device fuse and a semiconductor device fuse structure. A first dielectric layer is formed on top of a metal layer in a semiconductor device. The dielectric layer is patterned to provide access to fuse contacts located in one of the metal layers. A conductive pad metal layer is deposited and patterned to form a fuse between the fuse contacts. A second dielectric layer is deposited on the patterned conductive pad metal layer. This method permits fuses to be formed in the pad metal layer where the thickness of the dielectric over the area of the fuse to be blown may be more easily controlled.

In one aspect, the invention provides a method of forming a semiconductor device fuse. A first dielectric layer is deposited on the top-most copper metal layer in the device. The first dielectric is patterned to provide access to at least two fuse contacts. A conductive metal layer is deposited and patterned to form a fuse connecting the at least two fuse contact holes. A second dielectric layer is deposited on the patterned conductive layer.

In another aspect, the conductive metal layer is deposited and patterned to form a metal pad and a fuse connecting the at least two fuse contacts.

In yet another aspect a semiconductor device having a fuse is provided. The device comprises a first dielectric layer disposed on top of a top interconnect layer in the device. The first dielectric layer has an opening providing access to at least two fuse contacts. A fuse is formed in the pad metal layer and connects the at least two fuse contacts. A second dielectric layer is disposed on at least a portion of the fuse material in the pad metal layer.

These and other features and advantages of the present invention are described below with reference to the drawings.

BRIEF DESCRIPTION OF THE DRAWINGS

FIGS. 2A–2F depict stages in the method of forming a metal fuse in accordance with one embodiment of the present invention.

FIG. 3A depicts a top view of a metal pad and fuse formed in accordance with one embodiment of the present invention.

FIG. 3B depicts a cross-sectional view of the fuse illustrated in FIG. 3A.

DETAILED DESCRIPTION OF PREFERRED EMBODIMENTS

Figure 1:
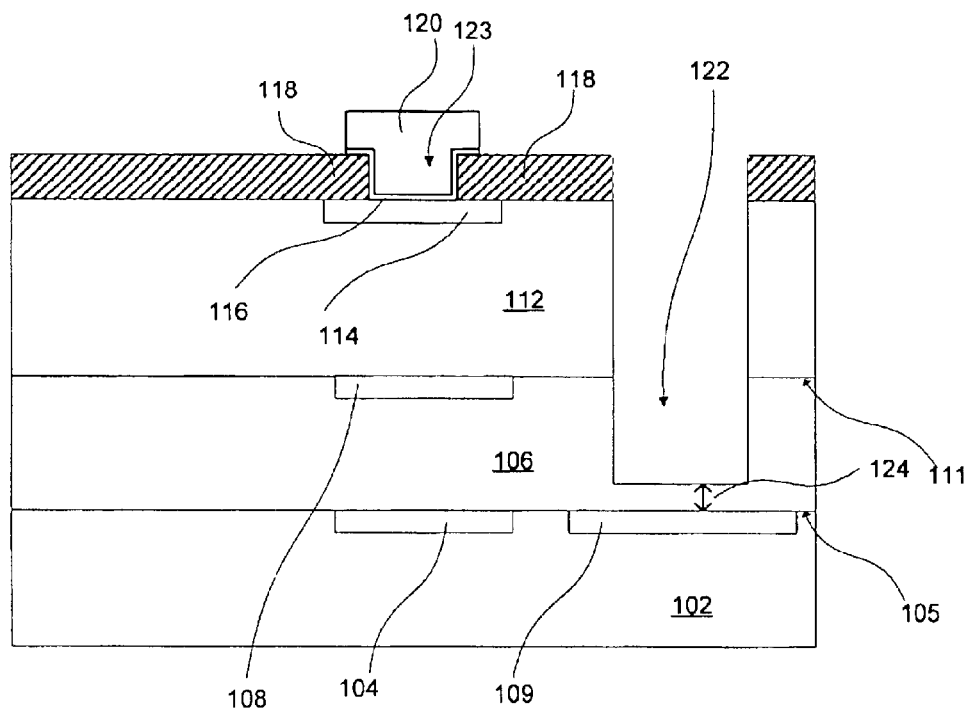
FIG. 1 depicts a semiconductor device having a fuse formed by conventional techniques.

Reference will now be made in detail to preferred embodiments of the invention. Examples of the preferred embodiments are illustrated in the accompanying drawings. While the invention will be described in conjunction with these preferred embodiments, it will be understood that it is not intended to limit the invention to such preferred embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

The present invention provides a method of forming a semiconductor device fuse and a semiconductor device fuse structure. In one embodiment, a first dielectric layer is formed on top of a metal layer in a semiconductor device. The first dielectric layer is patterned to provide access to fuse contacts in the top-most metal layer. A conductive pad metal layer is deposited and patterned to form a fuse between the fuse contacts. A second dielectric layer is deposited on the patterned conductive pad metal layer. This method permits fuses to be formed in the pad metal layer where the thickness of the dielectric over the area of the fuse to be blown may be more easily controlled than in fuses buried below several layers of dielectric formed by conventional methods. The placement of the fuse in the pad metal layer permits the formation of fuses that can reliably be blown, even where one or more thick redistribution layers are used in the device. Additionally, it prevents copper and low-k dielectric layers from being exposed.

According to this embodiment of the present invention, only one passivation (dielectric) layer is added to conventional processing. Conventional methods for formation of copper interconnect layers, i.e., those layers beneath the pad metal layer, may be used. The method departs from conventional techniques in the depositing, patterning, and etching of a second passivation layer. Additional features, such as openings in the first passivation layer, are also created so that the fuse may later be connected to underlying metal layers.

FIGS. 2A–2F depict stages in the method of forming a metal fuse in accordance with one embodiment of the present invention. The initial stages in the formation of the semiconductor device, i.e., through the formation of the top metal layer 204, 206 and the redistribution metal layer 211, 212, may be completed according to conventional techniques as described above with respect to FIG. 1. According to the techniques of the present invention, the fuse is formed in the pad metal layer rather than the top metal layer. Thus, as shown in FIG. 2A, no fuse will appear in the top metal layer 204, 206 in the partially formed semiconductor device 200 of the present invention. The method proceeds with the depositing of first dielectric layer 220 on the planar surface 214 of partially formed semiconductor device 200. The partially formed semiconductor device 200 comprises one or more metal layers. For illustrative purposes, only the redistribution metal layer 211,212, via metal layer 208, and the top metal layer 204, 206 are shown. Typically, copper is selected for the metal, via, and redistribution layers, especially as device sizes shrink. According to damascene techniques well know to those of skill in the art, copper is deposited in trenches etched into the dielectric layers to form the metal interconnect layers.

As discussed above, dielectric 202 is typically a low-k material. The redistribution metal layer 211, 212 comprises redistribution copper lines 211 as well as fuse contacts 212. Redistribution lines will typically form a grid on the device and distribute power to all sections of the device. The fuse contacts 212 typically connect to signal portions of the device and are fed through openings in the grid formed by the redistribution lines which appear in the redistribution layer 211, 212. The dielectric 207 in which the redistribution metal layer and the via metal layer 208 are formed may be a low-k dielectric or FSG, or comprise other suitable materials as known to those of skill in the art. Though the fuse contacts 212 are shown for illustrative purposes electrically connected to conductive lines in the metal layer 206, the invention is not so limited. The fuse contacts may be connected to any underlying metal interconnect layers in the semiconductor device.

The passivation layer 220 is a dielectric formed by conventional techniques known to those of skill in the art. For example, chemical vapor deposition may suitably be employed to deposit the passivation layer. In one embodiment, the passivation layer is deposited to a thickness which covers the planarized surface 214. The first passivation (dielectric) layer may be formed of silicon dioxide, silicon nitride, any other suitable material, or a combination of layers comprising said materials. The thickness of the first passivation layer is preferably between 5000 and 10,000 Angstroms.

In a subsequent step, as illustrated in FIG. 2B, the passivation layer 220 is patterned and etched to form fuse contact holes 224 and pad opening 226. The pad opening 226 is centered over the appropriate metal line 211 in the redistribution metal layer. Although the function of the redistribution metal layer is primarily to provide power to all portions of the device with a minimal drop in voltage, it will be understood by those of skill in the art that other metal contacts are conventionally formed in the redistribution metal layer to provide various signals for transmission to locations outside the device. Thus, these pads are not connected to supply voltages and, like the signals to and from the fuses, need to be electrically insulated from the supply voltages used by many of the conductive lines in the redistribution metal layer. A semiconductor device will often employ multiple metal interconnect layers, as many as seven or more. The metal layers shown underneath passivation layer 220 are meant to be illustrative, therefore, and not limiting. The patterned passivation layer (220a–220d) includes, in one embodiment, patterned passivation section 220c which forms an elevated portion for the formation of a fuse. In another embodiment, the passivation layer 220 is patterned such that no elevated portion (e.g. 220c) appears under the fuse. The passivation layer helps protect the layers underneath from laser energy. The protected layers include metal layer 206 and other metal layers and dielectric layers underlying the fuse.

Typically a conductive barrier layer (not shown) such as tantalum or tantalum nitride will then be deposited. This layer is needed to prevent interaction between copper in the redistribution layer and the metal in the conductive metal layer 230. The conductive metal layer 230 is then deposited on the combined barrier layer and patterned passivation layer (220a–220d), as illustrated in FIG. 2C. Any metal which may be suitably etched may be used for the conductive layer. In one embodiment aluminum is used. Copper is not suitable because it does not etch in a suitable manner. Aluminum is superior to copper for many fuse applications due to its lower thermal conduction, thus requiring a lower laser source energy level. The thickness of the conductive metal layer 230 is chosen to meet the requirements of chip bonding techniques and the requirements of metal fuse laser blowing. A suitable thickness of conductive metal layer 230 is 4000 to 12,000 Angstroms with a preferable range between 6000 and 10,000 Angstroms.

The conductive metal layer 230 is patterned and etched using conventional techniques to form a metal pad 234 and a fuse 236 as illustrated in FIG. 2D. In order to provide protection for the fuse, a second passivation layer 238 is deposited as illustrated in FIG. 2E. The second passivation layer may comprise any suitable dielectric such as silicon dioxide or silicon nitride. The material thickness of the second passivation layer 238 is selected to ensure that the dielectric film is sound, i.e., not subject to peeling or cracking or other film defects, but not so thick that the transmission of laser energy is substantially impeded. A suitable thickness will lie in the range from about 500 to 5000 Angstroms with a preferable thickness in the range of 1000 to 3000 Angstroms.

In a final step, as illustrated in FIG. 2F, the second passivation layer 238 is patterned and etched to form a pad opening 240. Through the pad opening 240, the metal pad 234 may be used to connect to external circuits using methods well known to those of skill in the art. For example, wire loops may be attached for wire bond devices and solder bumps may be attached according to conventional flip chip bonding techniques.

Many dielectrics exhibit absorption characteristics which vary in a periodic fashion when subjected to a laser or other energy beam. In one embodiment, the thickness of second passivation layer 238 is selected so as to maximize the absorption of laser energy (i.e., to minimize the reflectivity of the passivation layer) so that the fuse may be severed more easily. In another embodiment, the second passivation layer is thicker than an optimal thickness of the dielectric for absorption purposes. A window is partially etched into the second passivation layer to achieve the optimal dielectric thickness (i.e. where the absorption is maximized) over the area of the fuse to be blown. In this manner, the patterning of the fuse may be performed to create a self-aligned fuse.

FIG. 3A depicts a top view of a metal pad and fuse formed in accordance with one embodiment of the present invention. In order to form a semiconductor device having a fuse in accordance with the present invention, the metal layers and dielectric layers up to and including the redistribution metal layer are formed according to conventional techniques as discussed with reference to FIG. 1. FIG. 3B depicts a cross-sectional view of the fuse illustrated in FIG. 3A, through cross-section A—A'.

The metal fuse 302 is shown formed and configured through patterning and etching to have a thinned portion 304 designed to receive the laser energy necessary to sever the fuse. The thinned portion 304 is arranged between fuse pad portions 302a, 302b. Metal pad 310 is also formed in the same pad layer and used to connect the semiconductor device to external circuitry. The pad 310 and fuse pad portions 302a, 302b are not drawn to scale. Typically the pads will range in size from 50 to 100 microns. A typical width for the fuse pads 302a, 302b will be approximately 2.5 microns.

FIG. 3B illustrates in vertical cross-section the embodiment of FIG. 3A. A second passivation layer 320 (shown for clarity in FIG. 3B but not in FIG. 3A) is deposited above the fuse 302 and metal pad 310 to insulate the fuse from ambient conditions and also to prevent shorting of adjacent fuses when blown. The second passivation layer 320 is shown patterned and etched to permit external connection to pad 310. Although the fuse will rupture the dielectric when irradiated with laser energy, fuses formed in the pad metal layer do not suffer from the same contamination concerns as copper fuses formed in a top metal layer or other underlying metal layers. The metals used in the pad metal layer do not generally include copper, since it is difficult to bond to copper for purposes of providing eternal connections such as wire loops for wire bonded devices, flip chip bumps, etc. Thus, unlike copper fuses, the fuses of the present invention will not be prone to regrowth after being severed. The passivation layer deposited on top of the pad metal layer will not include low-k dielectrics. Low-k materials have typically been selected for their electrical characteristics, i.e. where the capacitance of the dielectric plays a critical role in determining the sufficiency of the signal propagation speed across the device. Low-k dielectrics need not be used in this location since the passivation layer does not normally play a critical role in transmitting signals across the device. Thus, the possibility of contamination of the dielectric layer after blowing the fuse is avoided by the flexibility available in selecting the dielectric material used in the second passivation layer or the first passivation layer 311. At interface 312, the fuse 302 and metal pad 310 are connected to conductive lines 314 and 316 in the redistribution metal layer. As discussed above, dielectric 318 maybe either a low-k dielectric or FSG. Even if a low-k dielectric is utilized, the passivation layer 311 will protect the dielectric 318 from contamination (e.g., moisture) from the atmosphere even after the fuse is blown.

As discussed above, due to reactions between copper and aluminum, a conductive barrier layer (not shown in FIGS. 3A, 3B) is deposited at interface 312 prior to depositing the conductive pad metal layer (302, 310). Suitable barrier layers include tantalum (Ta) and tantalum nitride (TaN). As shown, the fuse pads 302a, 302b connect through the first passivation layer 311 to metal lines 316 in the redistribution metal layer. These pads will in turn typically be connected to metal interconnects to other parts of the semiconductor device. Conductive lines 314 and 316 are part of the redistribution metal layer but will not typically be connected to the redistribution power network.

Although the foregoing invention has been described in some detail for purposes of clarity of understanding, it will be apparent that certain changes and modifications may be practiced within the scope of the appended claims. For example, the process of the present invention is applicable to any scheme where a pad layer metal fuse makes contact with any underlying metal interconnect layer in a semiconductor fabrication process. Accordingly, the present embodiments are to be considered as illustrative and not restrictive, and the invention is not to be limited to the details given herein, but may be modified within the scope and equivalents of the appended claims.

What is claimed is:

1. A semiconductor device having a fuse comprising:
   a first dielectric layer disposed on top of a top copper interconnect layer of a semiconductor device, said first dielectric layer having at least one opening providing access to at least two fuse contacts;
   a pad metal layer disposed on the patterned first dielectric layer, said pad metal layer forming a fuse connecting the at least two fuse contacts; and
   a second dielectric layer disposed on at least a portion of the fuse material in the pad metal layer.

2. The semiconductor device of claim 1 wherein the pad metal layer comprises aluminum.

3. The semiconductor device of claim 1 wherein the pad metal layer is further patterned to form a pad for connecting to an external circuit.

4. The semiconductor device of claim 3 wherein the second dielectric layer is patterned to form a pad opening over the pad.

5. The semiconductor device of claim 1 wherein the second dielectric layer is a conformal layer having a thickness selected so that the reflectivity of the dielectric layer over the area of the fuse to be blown is minimized.

6. The semiconductor device of claim 1 wherein the second dielectric layer over the area of the fuse to be blown has a thickness selected so that the reflectivity of the dielectric layer over the area of the fuse to be blown is minimized.

* * * * *